US012671372B2

(12) United States Patent (10) Patent No.: US 12,671,372 B2

Lesso et al. (45) Date of Patent: Jun. 30, 2026

(54) MODULATOR CIRCUITS

(71) Applicant: Cirrus Logic International Semiconductor Ltd., Edinburgh (GB)

(72) Inventors: John P. Lesso, Edinburgh (GB); John L. Melanson, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 93 days.

(21) Appl. No.: 18/766,958

(22) Filed: Jul. 9, 2024

(65) Prior Publication Data

US 2026/0019049 A1 Jan. 15, 2026

(51) Int. Cl.
H03F 3/217 (2006.01)
H04R 3/00 (2006.01)

(52) U.S. Cl.
CPC ............... H03F 3/217 (2013.01); H04R 3/00 (2013.01); *H03F 2200/03* (2013.01)

(58) Field of Classification Search
CPC ........ H03F 3/217; H03F 2200/03; H04R 3/00
USPC ......................................... 381/120
See application file for complete search history.

(56) References Cited

U.S. PATENT DOCUMENTS

2014/0097808 A1* 4/2014 Clark ........................ G05F 1/70
323/208

OTHER PUBLICATIONS

Le et al. ("Inductance-Independent Nonlinearity Compensation for Single-Phase Grid-Tied Inverter Operating in Both Continuous and Discontinuous Current Mode", IEEE Transactions on Power Electronics, Institute of Electrical and Electronics Engineers, USA, vol. 34, No. 5, May 1, 2019, pp. 4904-4919) (Year: 2019).*
International Search Report and Written Opinion of the International Searching Authority, International Application No. PCT/GB2025/051389, mailed Sep. 25, 2025.
Le, Hoai Nam et al., Inductance-Independent Nonlinearity Compensation for Single-Phase Grid-Tied Inverter Operation in Both Continuous and Discontinuous Current Mode, IEEE Transactions on Power Electronics, vol. 34, No. 5, May 2019.
Chen, Zhengge et al., A Mixed Conduction Mode-Controlled Bridgeless Boost PFC Converter and Its Mission Profile-Based Reliability Analysis, IEEE Transactions on Power Electronics, vol. 37, No. 8, Aug. 2022.

* cited by examiner

*Primary Examiner* — Paul Kim
(74) *Attorney, Agent, or Firm* — Jackson Walker L.L.P.

(57) ABSTRACT

This application relates to modulator circuits for driving switching output stages in a class-D amplifier system or the like. The switching output stage has an output node and high-side and low-side switches for selectively connecting the output node to respective high-side and low-side voltages and is configured to be operable in a continuous conduction mode of operation, in which there is always an output current flowing throughout a switching cycle and also in a discontinuous conduction mode of operation where there is a period in each switching cycle where there is no output current. The modulator circuit comprises a compensator operable to apply compensation, in the discontinuous conduction mode of operation, to at least partly compensate for a non-linearity when operating in the discontinuous conduction mode.

16 Claims, 3 Drawing Sheets

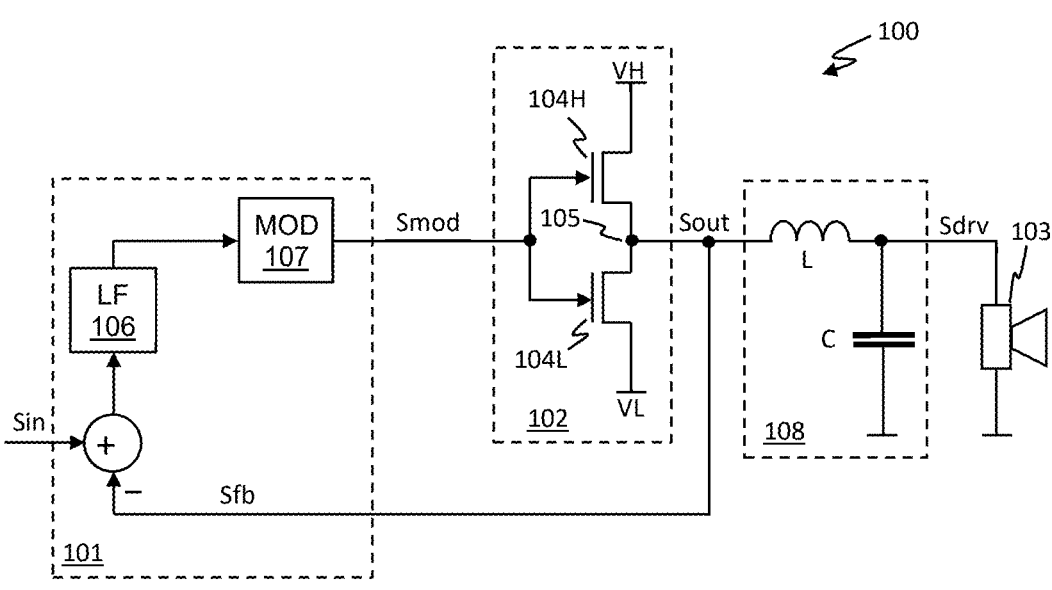
Figure 1
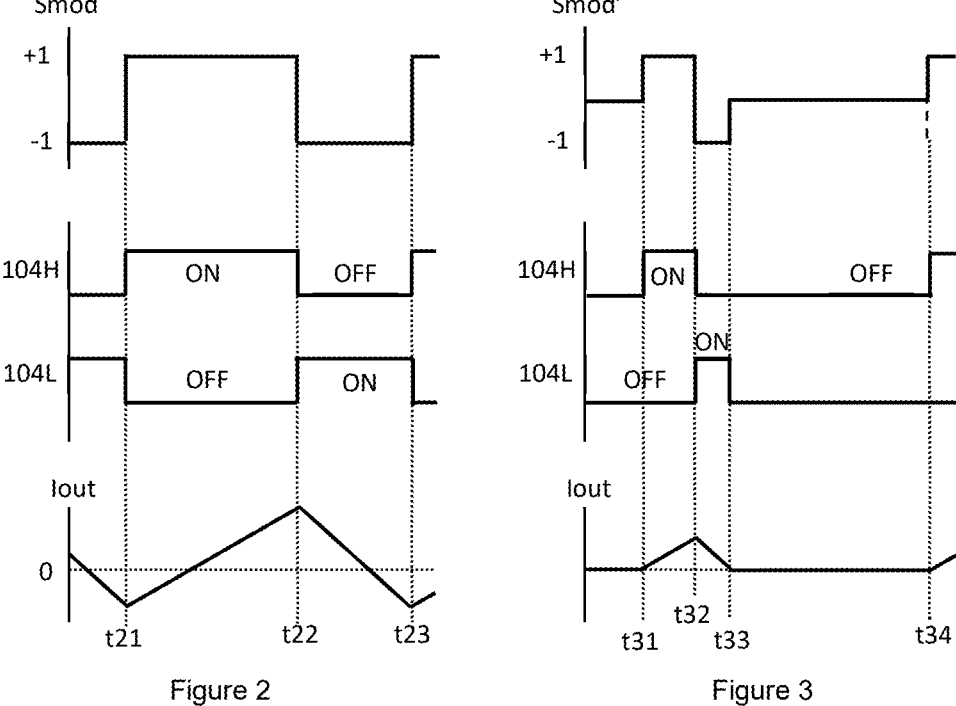
Figure 2                                Figure 3

MODULATOR CIRCUITS

The field of representative embodiments of this disclosure relates to methods, apparatus and/or implementations concerning or relating to modulator circuits for switched mode amplifiers, e.g. class-D amplifiers, in particular to modulator circuits for class-D amplifiers.

Class-D amplifiers, also referred to as switched-mode amplifiers, are used in a variety of applications, in particular for audio applications. Class-D amplifiers typically comprise a modulator circuit for receiving an input signal and generating a suitably modulated signal, e.g. a PWM (pulse-width-modulation) signal for controlling a switching output stage, which may, or may not, be integrated with the modulator circuit. The output stage controllably switches at least one output node between defined switching voltages with a controlled duty cycle, as controlled by the modulated signal. In some applications, the load may be connected between first and second output nodes, which are each switched between different switching voltages, in a bridge-tied-load configuration and the output stage may thus comprise a full-bridge output stage. In other embodiments, the load may be driven in a single-ended configuration by a half-bridge output stage modulating just one output node between the switching voltages, with the other side of the load held at a nominally fixed DC voltage, which may, for applications such as audio, typically be a midpoint voltage. Class-D amplifiers may be advantageously used in some applications as they can be more efficient than linear amplifiers.

However, in particular for some applications which require relatively high-power audio driving signals, the power consumption of a class-D amplifier may still be relatively significant, in particular if the amplifier is continuously enabled. In general, there is an ongoing desire for reduced power consumption and/or increased efficiency where possible.

Embodiments of the present disclosure relate to methods and apparatus for modulators for class-D amplifiers that address at least some of the above-mentioned issues.

According to an aspect of the disclosure there is provided a modulator circuit for generating a modulated signal based on an input signal for driving a switching output stage comprising an output node, a high-side switch configured to selectively connect the output node to a high-side voltage and a low-side switch configured to selectively connect the output node to a low-side voltage. The modulator circuit comprises a modulator configured to be operable to generate the modulated signal for controlling a duty-cycle of each of the high-side switch and low-side switch in a switching cycle in a complementary manner in continuous conduction mode of operation. The modulator is further configured to generate the modulated signal to control the duty-cycle of at least one of the high-side switch and low-side switch in a discontinuous conduction mode of operation where there is a period in each switching cycle where both the high-side switch and the low-side switch are off. The modulator circuit further comprises a compensator operable to apply compensation to a forward signal path of the modulator circuit in the discontinuous conduction mode of operation, wherein the compensation at least partly compensates for a non-linearity in a transfer function of the modulator circuit and output stage when operating in the discontinuous conduction mode.

In some implementations, the modulator may comprise a PWM modulator, wherein the PWM modulator has a forward modulator signal path and a modulator feedback path. The compensator may comprise a first function block configured to apply a first compensation function to the modulator forward signal path and a second function block configured to apply a second compensation function to the modulator feedback signal path. The first compensation function may correspond to an approximate inverse of the non-linearity. The second compensation function may correspond to the non-linearity. The modulator forward signal path may comprise a modulator filter upstream of a quantizer and the compensator may be configured to apply the first compensation function to the modulator forward signal path between the modulator filter and the quantizer. In some implementations, the first and second compensation functions may be determined as at least one of: a look-up table, a polynomial or spline function and a neural net.

In some implementations, the first and second compensation functions are predetermined stored compensation functions.

In other implementations, the compensator may be configured to receive an indication of an output signal which is output from the output stage and to adapt or learn the compensation required in the discontinuous conduction mode of operation. In some implementations, the compensator may be configured to receive a feedback signal from the output node of the output stage as said indication of the output signal. Additionally or alternatively, the compensator may be configured to receive a feedback signal from downstream of an output LC filter connected to the output node of the output stage as said indication of the output signal and the compensator may be further configured to at least partly compensate for the transfer function of the LC filter in the discontinuous conduction mode. The compensator is configured to use at least one of a least squares algorithm or stochastic gradient descent algorithm to determine the compensation function. The compensator may be configured to initially use a first learning algorithm to determine the compensation function and then swap to using a second learning algorithm to refine the compensation function, wherein the first learning algorithm is faster than the second learning algorithm but the second learning algorithm is less computationally intensive than the first learning algorithm.

The modulator circuit may further comprise a mode controller for controlling operation of the modulator circuit in the continuous conduction mode or the discontinuous conduction mode. The mode controller may be configured to control operation of the modulator circuit in the continuous conduction mode or the discontinuous conduction mode of operation based on at least one of: a signal level of the input signal and an indication of current reversal at the output node of the output stage during a switching cycle. The modulator circuit may be further configured to generate one or more switching control signals for controlling operation of the output stage in the continuous conduction mode or the discontinuous conduction mode of operation.

Aspects also relate to amplifier system comprising the modulator circuit of any of the embodiments described herein and the output stage.

In another aspect, there is provided an amplifier system for outputting an output signal to drive a transducer based on an input signal. The amplifier system comprises a switching output stage comprising an output node, a high-side switch configured to selectively connect the output node to a high-side voltage and a low-side switch configured to selectively connect the output node to a low-side and a modulator configured to generate a modulated signal based on the input signal. A mode controller is configured to control the switching output stage to selectively operate in one of: a continuous conduction mode of operation in which the high-side switch and the low-side switch are switched in a switching cycle in a complementary manner and the duty-cycle of each of the high-side switch and low-side switch is controlled based on the modulated signal; and a discontinuous conduction mode of operation in which there is a period in each switching cycle where there is zero output current at the output node and the duty-cycle of one of the high-side switch and low-side switch is controlled on the modulated signal. A compensator is configured to apply compensation in the discontinuous conduction mode of operation to at least partly compensate for a non-linearity in a transfer function of the amplifier system when operating in the discontinuous conduction mode.

In some implementations, in the discontinuous conduction mode of operation there is a period in each switching cycle where both the high-side switch and the low-side switch are off so as to provide said period where there is zero output current at the output node.

In another aspect, there is provided an amplifier coupled with an output inductor, the amplifier being controlled to operate in switching cycles to generate an output voltage. The amplifier is configured to be selectively operable in: a continuous conduction mode, where there is always current flowing through the output inductor throughout each of said switching cycles, and a discontinuous conduction mode, where for a portion of each of said switching cycles, no current flows through the output inductor. The amplifier comprises a compensator that applies compensation to a signal path of the amplifier when operating in the discontinuous conduction mode, to compensate for non-linearities introduced due to said portion of the switching cycle.

It should be noted that, unless expressly indicated to the contrary herein or otherwise clearly incompatible, then any feature described herein may be implemented in combination with any one or more other described features.

For a better understanding of examples of the present disclosure, and to show more clearly how the examples may be carried into effect, reference will now be made, by way of example only, to the following drawings in which:

FIG. 1 illustrates one example of a conventional class-D amplifier system;

FIG. 2 illustrates conventional operation of a single-ended class-D amplifier system with continuous conduction;

FIG. 3 illustrates operation of a single-ended class-D amplifier system with discontinuous conduction according to an embodiment;

Figure 4:
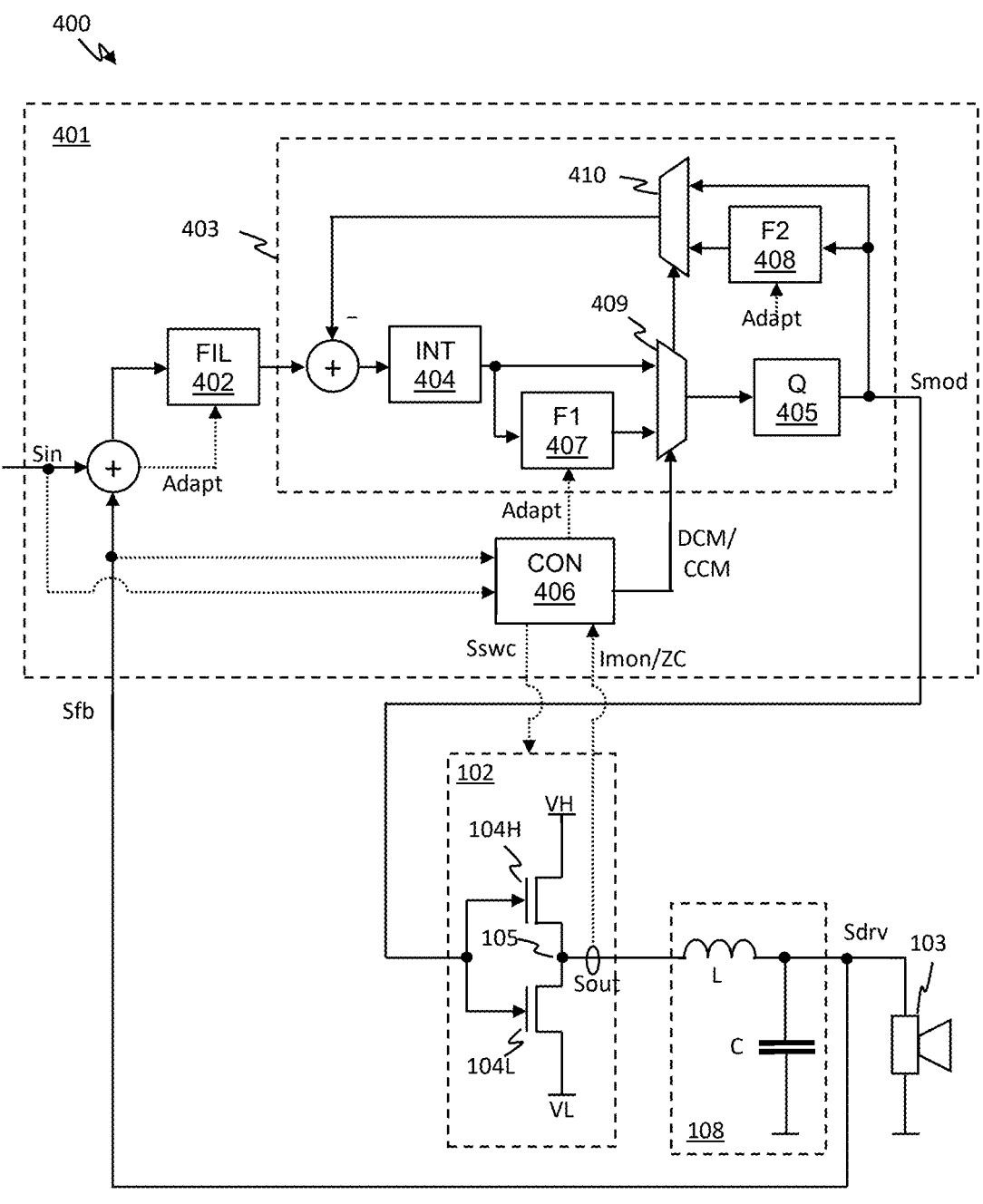
FIG. 4 illustrates an example of class-D amplifier system operable with discontinuous conduction according to an embodiment.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

FIG. 1 illustrates one general example of a conventional class-D amplifier system 100. The amplifier system 100 comprises a modulator circuit 101 configured to receive an input signal Sin and to generate a modulated signal Smod for driving switching output stage 102, e.g. a class-D output stage, to generate an output signal Sout for driving a load 103.

For audio applications, the input signal Sin may be an audio signal and the load 103 may be an audio output transducer such as a loudspeaker, however the disclosure is not limited to audio and a modulator circuit according to an embodiment could be used in other applications as part of a class-D or switched mode driver for driving some other type of load with a time varying signal.

The output stage 102 may be any suitable switching output stage for modulating at least one output node between selected switching voltages with a duty cycle defined by the modulated signal Smod. FIG. 1 illustrates the output stage 102 as a half-bridge output stage with high-side and low-side switches 105H and 105L for selectively switching output node 105 between high-side and low-side switching voltages VH and VL respectively, so as to generate an output signal Sout for driving the load. Note that, as used herein, the terms high-side and low-side, in relation to the voltages, shall be understood as meaning that the high-side voltage is more positive/less negative than the low-side voltage and these terms imply nothing about the magnitudes of the respective voltages. In some examples, the high-side voltage could be a positive supply voltage and the low-side voltage could be ground, but in a bipolar example, the high-side voltage may be a positive supply voltage and the low-side voltage may be a negative supply voltage, which may be of equal magnitude to the high-side voltage.

In example of FIG. 1, the output stage 102 drives the load in a single-ended configuration, and thus modulates the voltage on one side of the load 103, with the other side of the load being held at a nominal fixed DC voltage. The fixed DC voltage may, in some applications, be a mid-point voltage which is midway between the high-side and low-side voltages VH and VL, so that positive and negative drive voltages, of a magnitude up to $(VH-VL)/2$ can be developed across the load. It will be understood, however, that the output stage 102 could alternatively be configured to drive the load in a bridge-tied-load (BTL) configuration and the output stage 102 may comprise a full-bridge output stage and thus voltages on both sides of the load could be modulated so as to develop a suitable differential drive voltage across the load.

The output stage 102 may be integrated with the modulator circuit 101 as part of the same integrated circuit (IC), i.e. the output stage 102 may be on-chip with the modulator circuit 101. In some implementations, however, the output stage 102 may be formed as part of a separate integrated circuit to the modulator circuit 101, with the modulator circuit IC having suitable connections for connecting to the output stage IC, possibly as part of the same IC package, or as separate IC packages, in a host device. For instance, for some applications, such as for relatively high-power audio applications, there may be advantages in implementing the modulator circuit 101 as part of an IC formed using conventional silicon processing technologies, whilst using compound semiconductor processing, e.g. GaN processing, for the IC for the output stage 102. In which case, it may be advantageous, for cost reasons, to implement the output stage as a half-bridge single-ended driver stage, such as illustrated in FIG. 1, so as to reduce the number of switching devices compared to a BTL implementation and to use a relatively high magnitude input voltage, i.e. an input voltage Vin defined by the difference between the high-side and low-side switching voltages, Vin=VH−VL.

The amplifier system 100 of FIG. 1 is illustrated as a closed loop amplifier system and thus the modulator circuit 101 receives a feedback signal Sfb which is indicative of the output signal Sout that is output from the output stage 102. FIG. 1 illustrates, generically, that the feedback signal Sfb may be subtracted from the input signal Sin (or vice versa) to generate an error signal which is filtered by a loop filter 106 and input to modulator 107 to generate the modulated signal Smod, however one skilled in the art will understand that there are various different ways in which the modulator circuit may be configured, for instance such an error signal could be combined with the input signal before or after filtering by the loop filter. The modulator 107 may typically be a pulse-width-modulation (PWM) modulator which compares the output of the loop filter 106 with a suitable triangle or sawtooth waveform to generate the modulated signal Smod, which may thus be a PWM waveform.

In some implementations, such as illustrated in FIG. 1, an output filter 108 may be provided in the output path between the output stage 102 and the load 103, to provide low-pass filtering of the output signal Sout so as to provide a drive signal Sdrv for driving the load. In some implementations, the output filter 108 may be implemented as an LC filter with an inductor L in series in the output path and a capacitor C connected between the output path and a defined DC voltage. It will be understood, however, that other output filters could be implemented, such as an RC filter. In the example of FIG. 1, the feedback signal Sfb is tapped from the output path upstream of the output filter 108, but again other arrangements are possible.

In use, the modulator circuit 101 thus generates the modulated signal Smod based on the input signal Sin combined with the feedback signal Sfb and outputs the modulated signal Smod to control switching of the output stage 102. For the single-ended configuration illustrated in FIG. 1, the modulated signal Smod controls switching of the high-side and low-side switches 104H and 105L of the output stage in a complementary fashion, i.e. so that one of the switches is turned on when the other is turned off, so that the output stage transitions between a first switch state, with the high-side switch 105H on or closed and the low-side switch 105L off or open to drive the output node to the high-side voltage VH, and a second switch state, with the high-side switch 105H off or open and the low-side switch 105L on or closed to drive the output node to the low-side voltage VL. The duty-cycle of operation in these two states is controlled by the modulated signal and thus the duty-cycles for the high-side switch 104H and 104L are complementary (i.e. the on-period for one switch corresponds to the off-period for the other switch and vice versa) and each is controlled by the modulated signal. The modulated signal Smod thus controls the output stage 102 according to a binary modulation, as illustrated in FIG. 2.

FIG. 2 illustrates an example of the waveform for the modulated signal Smod and the resulting switch states of the high-side and low-side switches 104H and 104L, and also the output current Iout from the output stage (assuming that the output current and voltage are in phase for ease of explanation). In the illustrated example, the modulated signal Smod swaps between two levels, which have been labelled as +1 and −1, which control the output stage 102 to be in the first switch state or the second switch state respectively.

FIG. 2 illustrates that at a time t21 the value of the modulated signal Smod goes to the +1 level and controls the output stage 102 to transition to the first switch state, with high-side switch 104H on and low-side switch 104L off.

This connects the output node 105 to the high-side voltage VH, and, in this state, the inductance of the series inductor L and/or any inductance of the load 103, will cause the output current to ramp up, i.e. become more positive/less negative. The modulated signal Smod remains at the +1 level until time t22, when it transitions to the −1 level and causes the output stage 102 to transition to the second switch state with the high-side switch 104H off and the low-side switch 104L on. This connects the output node 105 to the low-side voltage, with the result that the output current ramps down, i.e. becomes less positive/more negative. At a time t23, the modulated signal Smod transitions back to the +1 level and the output stage switches back to the first switch state. The period between times t21 and t23 is equal to the switching cycle period (although the start and end of each switching cycle may be defined by a PWM carrier waveform as will be understood by one skilled in the art and a change in switch state may not be synchronized to the start of the switching cycle). FIG. 2 illustrates an example where the duty-cycle of the modulated signal Smod (in terms of the proportion of the switching cycle spent at the +1 level compared to the −1 level) is slightly greater than 50%, which would lead to the average voltage at the output node 105, over the course of a switching cycle, being positive and an average positive output current Iout over the switching cycle.

It will be understood by one skilled in the art that, as part of the transition between the first switch state and the second switch state, the relevant switch which is being turned off may be turned off before the other switch is turned on, or at least the gate drive to transition the relevant switch from being on to being off may begin prior to the gate drive to transition the other switch from off to on. This is to avoid both the high-side and low-side switches being sufficiently conductive at the same time as one another, which could result in current shoot-through. This sequencing of the switch transitions may result in a short dead-time, where both switches are substantially off, as part of the transition between the switch states. Such a dead-time is generally kept as short as possible to avoid any distortion in the output signal and generally an output current would continue to flow during the dead-time, via a diode associated with one of the switches. One skilled in the art will understand that the high-side and low-side switches will generally be implemented by transistors, such as FETs, which will have an inherent body diode that can allow for current conduction in one direction, if suitably biased, when the switch is off, and/or some implementations may specifically provide a separate diode in parallel with the switch. Thus, for example, when transitioning from the first switch state to the second switch state, the high-side switch 104H may be turned substantially off before the low-side switch 104L is turned substantially on, and, if there were a positive output current flowing at this point in time, the current would flow via the diode of the low-side switch until the low-side switch turns on.

It will be seen that this operation results in an essentially continuous ripple current in the output current Iout. In other words, there is an essentially continuous output current flowing, and thus this operation may be referred to as a continuous conduction mode (CCM) of operation. As will be understood by one skilled in the art, this continuous ripple current can result inductor core loss in the inductor of the output filter and, as illustrated, the direction of the output current may reverse at low input signal magnitude and this can be relatively wasteful in terms of power consumption for low magnitude input signals, for instance when the amplifier system is active but there is only a quiescent input signal level. This may particularly be an issue for applications in which the amplifier system may be generally active, e.g. to provide audible notifications and/or warnings when required, even in the absence of any media playback or the like.

Embodiments of the present disclosure relate to a modulator circuit which is operable in a mode of operation to control the output stage in a switch state in which the output current may be discontinuous, i.e. the output current may ramp to zero during the switching cycle and may remain at zero for a significant part of the switching cycle. Such a switch state can be achieved, for a single-ended output stage, by turning off both the high-side and low-side switches connected to an output node, i.e. any switch connecting the output node to a supply voltage or other defined voltage, i.e. switching the output node to a high-impedance state (as seen from the load). This mode of operation may thus be referred to as a discontinuous conduction mode (DCM).

FIG. 3 illustrates this principle of operation. FIG. 3, like FIG. 2, illustrates switch states that will lead to an average positive voltage over the course of a switching cycle and an average positive output current (again ignoring any phase difference between output voltage and current for ease of explanation). In the example of FIG. 3, the output stage 102 is switched to the first switch state, with the high-side switch 104H on and the low-side switch 104L off, at a time t31 and the output current Iout ramps up—in this case from zero. The output stage 102 is maintained in this first switch state until a time t32 when, in this example, the output stage is switched to the second switch state with the high-side switch 104H off and the low-side switch 104L on.

At a time t33 the low-side switch 104L is turned off. In this example, the low-side switch 104L is turned off such that there is not any significant reversal of output current Iout, i.e. there is no reversal or output current or only a limited amount of reverse current as will be described in more detail below. At this time t33, the high-side switch 104H is not turned on and instead is maintained in the off state. The output stage 102 is thus operated in a third switch state in which both the high-side and low-side switches are off and the switching of the high-side switch 104H and low-side switch 104L is not complementary. If the output current Iout is at zero at time t32, the output current will thus remain at zero in this third switch state. Otherwise, if there is some output current flowing, this current may initially continue to flow via a diode associated with one of the high-side or low-side switches 104H or 104L, depending on the current direction, but will ramp to zero and then will remain at zero, i.e. will not reverse direction. As noted above, the high-side and low-side switches will generally be implemented by transistors such as FETs which will have an inherent body diode and/or some implementations may specifically provide a separate diode in parallel with the switch.

In some implementations, this conduction via a diode of the low-side switch 104L could be used (for positive output voltage/currents) instead of turning the low-side switch 104L on at time t32. That is, the high-side switch 104H could be turned on at time t31 and turned off at time t32 as described, but the low-side switch 104L may not be turned on at this time t32 and thus the output stage may transition from the first switch state to the third switch state. When the high-side switch 104H turns off, the positive output current Iout may thus flow via the diode associated with the low-side switch 104L and will ramp down to zero and will then extinguish, i.e. will not reverse. This can be advantageous in that no timing control of the low-side switch 104L is needed (for positive output voltages/currents) to ensure no current reversal and, whilst the diode associated with the low-side switch may present a greater resistance that the on-resistance of the switch, leading to some additional conduction losses associated with diode conduction, this operation can also avoid the power loss associated with charging and discharging the gate capacitance of the low-side switch, and may thus provide additional power savings.

In either case, the output stage 102 is then maintained in this third switch state until a time t34, when the output stage transitions to the first switch state in the next switching cycle and the high-side switch 104H is turned back-on. In this example, the period between times t31 and t34 is equal to the switching cycle period (but again the actual start and end times of each switching cycle may depend on the relevant carrier waveform and turn on of the high-side switch 104H is not necessarily synchronised to the start of the switching cycle). It will be seen that the both the high-side and low-side switches 104H and 104L are off (between times t33 and t34) for a significant proportion of this switching cycle period and that the output current may thus be zero for a significant proportion of the switching cycle. The duty-cycles of the high-side and low-side switches 104H and 104L are not complementary (in that there is a significant gap between one switch being turned off and the other switch being turned on).

It will be understood that this is operation in the third switch state in DCM is different to any dead-time period which is implemented during a transition between the first and second switch states to prevent current shoot through, i.e. the dead-time period discussed above where the high-side switch 104H is turned off before the low-side switch 104L is turned on, or vice versa, during a transition between the first and second switch states. In the third switch state as used in DCM, i.e. in the period between t33 and t34 illustrated in FIG. 3, both of the high-side switch 104H and the low-side switch 104L are hard off, i.e. held fully off by suitable gate control signals. This may not, in some implementations, be the case during a dead-time period during a transition between the first and second switch states, such as the transition illustrated at time t32, as the gate drive of the low side switch 104L to turn it on may begin whilst the gate drive to fully turn the high-side switch 105H is still being applied, and thus both switches may not be fully off at the same time (just one switch will be sufficiently non-conductive to prevent any current shoot through). Even if, in some implementations, a dead-time period implemented as part of complementary switching did involve some period where both the high-side and low-side switches 104H and 104L are hard off, this is a transitory state in the transition between the first and second switch states and will only persist for some small fraction of the switching cycle, e.g. less than 1% of the switching cycle. The turn-off of the high-side switch 104H and turn on of the low-side switch 104L are triggered by the same event, e.g. the transition of the modulated signal from +1 to −1, even if there is some small sequencing delay applied to the turn on of the low-side switch 104L. As a result, an output current may continue to flow throughout substantially the whole of the dead-time period. By contrast, the third switch state as used for DCM is not merely a transitory state, but a destination state in its own right. Entering the third state (e.g. by turning off the low-side switch 104L at time t33) is triggered by a different event to exiting the third state (e.g. by turning on the high-side switch 104H at time t34). The duration of an instance of the third state in the discontinuous current mode may be for a significant proportion of the switching cycle, e.g. 1% or more, in some cases 5% or more, and could, in some cases be as high as 90% or more of the switching cycle. The proportion of a switching cycle spent in the third switch state is variable and may vary with signal level. DCM operation in the third state is deliberately controlled to provide a significant period of zero output current.

This operation effectively changes the output stage from operating with a binary modulation to a ternary modulation, where the output stage can effectively be in any of three different states which can be seen as +1, −1 or 0. FIG. 3 illustrates an effective equivalent modulated signal Smod' that could implement the ternary modulation to control the switching of the output stage, which is a three-level signal. Note, the ternary modulated signal represented by Smod' may not actually be generated in practice and this operation may be implemented by using a binary modulated signal as output from the modulator circuit with some additional switching control of the output stage 102 to implement the discontinuous conduction mode, as discussed in more detail below.

The operation illustrated in FIG. 3 supplies a positive output current to the load over the course of a switching cycle, but operating in the third switch state, where the output current is zero for at least part of the period of operation in the third switch state, can reduce or avoid any significant reverse output current flowing during the switching cycle, and reduces the overall ripple in the output current, which can provide significantly less power consumption compared to the example of FIG. 2.

For a negative output current, the order of operation in the first and second switch states (with respect to a period of operation in the third switch state) can be reversed, i.e. the output stage 102 may be switched from the third switch state, with both the high-side and low-side switches 104H and 104L off and no substantial output current flowing, to the second switch state with the low-side switch 104L on to cause the output current Iout to ramp down, i.e. to cause a negative output current to flow with an increasing magnitude. The output stage 102 may then be subsequently switched to the first switch state, with the high-side switch 104H on, so that the output current ramps up (i.e. the magnitude of the negative current decreases). The high-side switch 104H may then be switched off without any significant current reversal, i.e. before any significant positive output current flows, and the output stage maintained in the third switch state for the rest of the switching cycle. Alternatively, as discussed above diode conduction could be used for the current ramp-down. Thus, instead of turning the high-side switch 104H on when the low-side side switch 104L is turned off, the high-side switch 104H could be maintained off and the output stage 102 could thus transition between the second switch state and the third switch state, in which case the negative output current would flow via a diode associated with the high-side switch 104H and ramp to zero.

Such a discontinuous conduction mode (DCM) can thus offer advantages in terms of reduced power consumption compared with the conventional continuous conduction mode (CCM) discussed with reference to FIG. 2, in situations where the output current could reverse during continuous conduction. However, this operation does require a change in the switching control of the high-side and low-side switches 104H and 104L of the output stage 102.

FIG. 4 illustrates one example of an amplifier system 400 including a modulator circuit 401 according to an embodiment, in which similar components as discussed with respect to FIG. 1 are identified by the same references.

Like FIG. 1, the modulator circuit 401 is operable to generate a modulated signal Smod for controlling switching of an output stage 102, which in this example is a half-bridge output stage with a high-side switch 104H and low-side switch 104L, for generating an output signal Sout to drive load 103 in a single-ended driver configuration via output filter 108. As discussed with reference to FIG. 1, the output stage 102 may or may not be integrated as part of an integrated circuit with the modulator circuit 401.

In a similar manner as discussed with reference to FIG. 1, the modulator circuit 401 is configured to receive a feedback signal Sfb indicative of the output signal Sout. The feedback signal Sfb may be combined with the input signal Sin to generate an error signal component which is filtered by filter 402 of the modulator circuit. The output of the filter 402 may be provided to a PWM modulator 403 so as to generate the modulated signal Smod. Again, it will be understood that other feedback arrangements may be used in some implementations.

The PWM modulator 403 has a modulator forward signal path comprising a modulator filter 404, in this example an integrator, and a quantizer 405. The quantizer 405 may comprise a PWM quantizer for outputting a PWM output or may comprise a sigma-delta quantizer followed by a PWM block, as would be understood by one skilled in the art. The modulator 403 also comprises a modulator feedback path for providing feedback from the output of the quantizer 405 to upstream of the integrator 404.

The amplifier system 400 is controllably operable in either of a continuous conduction mode (CCM) and a discontinuous conduction mode (DCM) and may swap between these different modes of operation under the control of a mode controller 406. In the different modes of operation, functional blocks 407 and 408 (which collectively form at least part of a compensator) may be enabled/disabled in the modulator forward and feedback paths respectively, for instance by being switched into or out of the relevant signal paths by selectors 409 and 410 respectively, as will be discussed in more detail below.

FIG. 4 illustrates that the mode controller 406 is part of the modulator circuit 401 but this need not be the case and, in particular if the output stage 102 is not integrated with the modulator circuit, at least some of the functionality of the mode controller 406 may be implemented as part of the output stage.

When operating in CCM, the output from the filter 402 may be provided to the modulator 403 to generate the modulated signal Smod in the conventional manner, i.e. such as described with reference to FIG. 2. In which case, the modulated signal Smod may be a binary modulated signal, e.g. a binary PWM signal, which is used to control the output stage to switch between the first switch state (with high side switch 104H on and low-side switch 104L off) and the second switch state (with high side switch 104H off and low-side switch 104L on) with complementary duty-cycles.

When operating in DCM, the switching of the output stage 102 is varied to include at least one instance of the third switch state in which the inductor current is zero for a significant period and the duty-cycles of the high-side switch and low-side switch are not complementary.

In DCM, the timing of turn-on and turn-off of at least one of the high-side and low-side switches 104H and 104L (depending on the polarity of the output signal) will be determined by the control loop of the amplifier and may be controlled by the modulated signal Smod being at the +1 or −1 level respectively for an appropriate portion of the switching cycle. In other words, the duty-cycle for one of the high-side switch 104H or low-side switch 104L may be controlled solely by the modulated signal. However, the turn-on of the other switch may be inhibited (to rely on diode conduction during the current ramp down to zero), or, if that other switch is turned on, the subsequent turn off of that other switch may be separately controlled to prevent any significant current reversal. As such the mode controller 406 may generate one or more additional switch control signals Sswc for controlling switching of the output stage 102.

For example, for a positive output voltage/current, the high-side switch 104H may be turned on by the modulated signal Smod transitioning to the +1 level and may remain on for as long as the modulated signal remains at the +1 level. The modulated signal Smod may then transition to the −1 level, which results in the high-side switch 104H being turned off. If turn on of the low side switch 104L is inhibited, so as to rely on diode conduction for the current ramp to zero, the switch control signals Sswc from the mode controller may thus enable switching of the high-side switch 104H based on the modulated signal Smod but disable switching of the low-side switch 104L (for positive output voltages/currents). Alternatively, if the low side switch 104L is to be turned on when the high-side switch 104H is turned off, the transition of the modulated signal from +1 to −1 may cause the output stage 102 to transition from the first switch state to the second switch state (with an appropriate dead-time) and turn on the low-side switch 104L, but the low-side switch 104L may be subsequently turned off without turning the high-side switch 104H back on, so as to switch the output stage to the third switch state, based on some indication of the output current Iout. For instance, a current monitoring signal Imon or some zero-crossing detection ZC could be implemented as would be understood by one skilled in the art. Such current monitoring/zero-crossing detection signals could be supplied to the mode controller 406 such that the mode controller 406 signals the output stage when to turn the low-side switch 104L off, or the output stage 102 may be arranged to monitor the current monitoring/zero-crossing detection signals when indicated by the mode controller 406 via the switch control signals.

For a negative output voltage/current, the timing of operation of the output stage being in the second switch state, with the low-side switch on, would be controlled by the timing of a period of the modulated signal at the −1 level, with the high-side switch 104H either being inhibited from turning on, or being turned on and then turned off based on the current monitoring/zero-crossing detection signals.

Operating in DCM, with the resulting change in switching control of the output stage 102, does vary the transfer function of the amplifier system.

For CCM, such as described with reference to FIG. 2, the average voltage of the output signal Sout, is generally linear with duty cycle of the modulated signal Spwm (subject to noise and error of the output stage). For DCM, this is no longer the case, and DCM operation can be thought of as introducing non-linearity into the operation of the amplifier system.

One source of non-linearity is that the transfer function between the input of the amplifier system and the output signal Sout is not linear. DCM operation may, in some respects, be seen as being closer to an energy transfer mode, which may provide a non-linearity in the relationship between Sout and Sin and form of a square root transfer function. It will be noted that during the period of operation in the third state, the output node 105 is effectively left floating and is not connected to any defined voltage.

To account for such non-linearity the amplifier system 400 of FIG. 4 is operable in the discontinuous conduction mode to apply a compensation function to, at least partly, compensate for such non-linearity. In the example of FIG. 4, the compensation is applied, at least partly, by functional blocks 407 and 408 being enabled in the modulator forward signal path and modulator feedback path respectively in DCM. The transfer functions of the functional blocks 407 and 408 are configured such that the overall transfer function of the modulator 403, when operating in DCM, at least partly compensates for the non-linearity that is expected when operating in DCM. Functional blocks 407 and 408 can thus be collectively seen as a compensator for applying compensation to the forward signal path of the amplifier system.

In particular, the transfer function F1 of the functional block 407 within the modulator forward signal path may correspond to the inverse of the non-linearity that is expected when operating in DCM, whilst the transfer function F2 of the functional block 408 within the modulator feedback signal path may correspond to the non-linearity.

Considering the overall transfer function of the modulator 403 itself, the output signal Smod from the modulator can be represented as:

$$Smod = (Sx - KNL \cdot Smod) \cdot KNL^{-1} \cdot KQ$$

where Sx is the input signal to the modulator 403, $KNL^{-1}$ is the transfer function F1 of functional block 407 in the modulator forward path which corresponds to the inverse of the non-linearity of the system, KNL is the transfer function F2 of functional block 408 in the modulator feedback path which corresponds to the non-linearity of the system, and KQ is the transfer function of the filter 402 and quantizer 405. This can be rewritten as:

$$Smod = Sx \cdot (KNL^{-1} \cdot KQ)/(1 + KNL \cdot KNL^{-1} \cdot KQ)$$

so the transfer function of the modulator 403 can be seen as:

$$(KNL^{-1} \cdot KQ)/(1 + KNL \cdot KNL^{-1} \cdot KQ)$$

which, for low frequencies, is approximately equal to 1/KNL. The modulator 403 thus has a transfer function that effectively compensates for the non-linear transfer function KNL of the system.

The non-linearity in the transfer function between Sin and Sout when operating in DCM, and hence the required first and second compensation functions for the functional blocks 407 and 408, may be determined in various ways. In some embodiments, the relevant non-linearity and inverse function may be determined as part of a factory calibration step. For instance, the output Sout of the output stage could be monitored in response to applied input signals and used to determine the non-linearity of the amplifier system and then the relevant inverse function for the functional blocks 407 and 408. The relevant transfer function for the functional blocks 407 and 408 may be provided in any appropriate form, such as a look-up table, a polynomial or spline function, a neural net, or similar as would be understood by one skilled in the art.

Whilst a factory calibration may be suitable for some applications, in other applications it may be preferable to update or adapt the compensation functions in use, e.g. to learn or adapt the non-linearity and/or appropriate compensation to be applied as some learning or adaptive process.

A controller for the functional blocks 407 and 408 may thus be configured to receive an indication of the output signal Sout and to learn the non-linearity of the system, and inverse of the non-linearity, when operating in DCM. FIG. 4 illustrates that the mode controller 406 may be configured to adapt the functions F1 and F2 of the functional blocks 407 and 408, but it will be understood that some other controller could be provided in some applications, or the relevant controller could be implemented as part of the functional blocks 407 and 408.

In some implementations, such as illustrated in FIG. 4 the controller 406 may receive the feedback signal Sfb. This feedback signal may be an analogue signal and thus the controller 406 may include, or receive the feedback signal via, an ADC (not separately illustrated) so as to provide a digital version of the feedback signal for the purposes of learning the relevant compensation to be applied.

Figure 5:
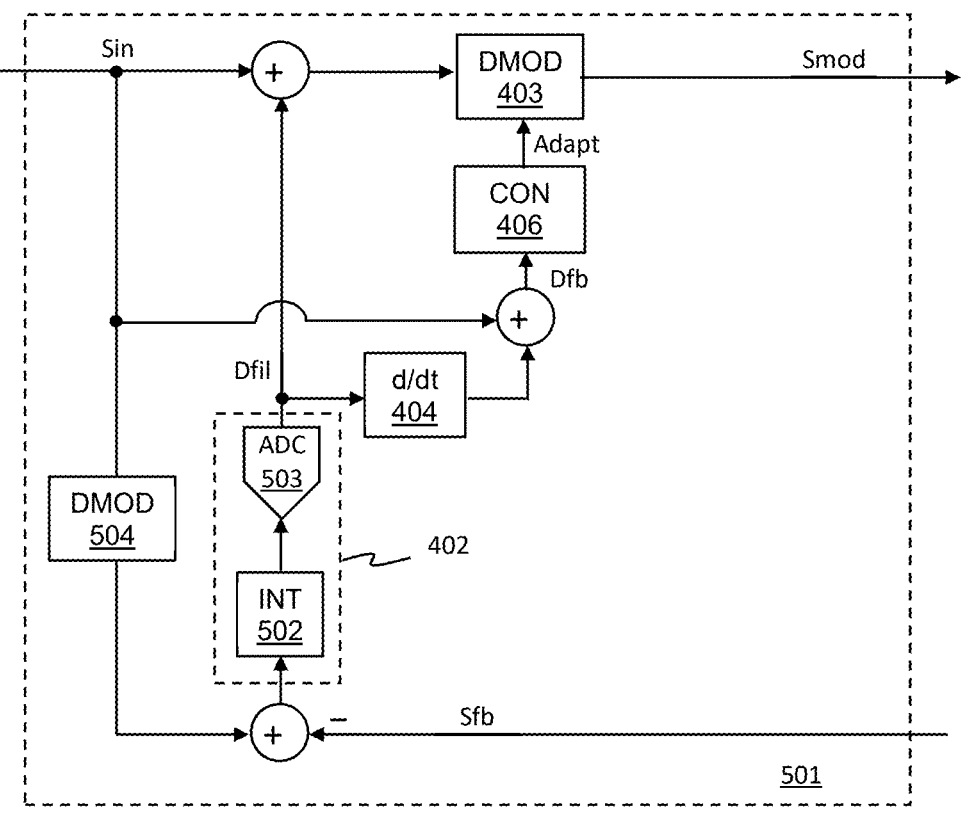
FIG. 5 illustrates another example of a modulator circuit according to an embodiment.

In some applications, however, the nature of the modulator circuit may effectively allow a digital version of the feedback signal to be generated without requiring a dedicated ADC for this purpose. For instance, FIG. 5 illustrates an example of part of a modulator circuit 501 in which similar components are identified by similar reference numerals. In the modulator circuit 501, the modulator 403 is a digital modulator, such as a digital PWM modulator for receiving a digital input to generate the modulated signal. In this example the filter 402 is a hybrid filter for receiving an analogue input and providing a digital output and, in this example, is represented by at least one analogue integrator stage 502 and an ADC 503.

The input to the filter 402 is an error signal generated by subtracting the feedback signal from a version of the input signal which has been processed in a feedforward path, e.g. by digital modulator 504 which is matched to the digital modulator 403. The processing in this feedforward path may provide suitable phase matching and allows for modulation tones and noise in the feedback signal to be suitably cancelled by corresponding components in this version of the input signal. The resulting error signal is filtered by filter 402 to provide a digital filtered signal Dfil, which is this example is then combined with the input signal Sin in the main forward signal path upstream of the modulator 403.

The digital filtered signal Dfil, is essentially an integrated version of the error between the input signal and the feedback signal. By differentiating this signal Dfil and adding it to the input signal, a digital version of the feedback signal Dfb is generated, which is thus indicative of the output signal Sout or drive signal Sdrv as appropriate (depending on where the feedback signal was tapped). This digital feedback signal can thus be supplied to the controller 406 for learning/adapting the compensation to be applied in DCM.

Note that this principle of recreating a digital version of the feedback signal represents a novel aspect of the disclosure that could be used for other purposes in addition to or instead of providing a signal for adaptation of a compensation function and the idea of recreating a digital version of the feedback signal could be applied to implementation that are not operable in DCM.

The controller 406 may thus receive an indication of the output signal and implement some learning process, which may be a learning algorithm such a least squares algorithm or similar or variant of stochastic gradient descent to learn the relevant compensation required. In some implementations a fast-learning method, such as a Recursive Least Squares (RLS) or Levinson Durbin (LD) approach could be used, although such methods may be relatively computationally expensive. In some cases, such a fast-learning method may be used initially, e.g. following a first instance of DCM on start-up or reset, for a relatively short period to provide an initial fast convergence towards the correct compensation, and then the controller 406 may switch to using a slower, but computationally less expensive algorithm, such as least mean squares (LMS) to refine the compensation applied. As noted above, the compensation to be applied may be determined as a suitable look-up table, or polynomial or spline algorithm, or neural net.

It should be noted that the compensation function F1 for functional block 407 corresponding to inverse of the non-linearity need only be determined to be approximately correct. As this function is applied to the modulator forward signal path after the modulator filter 404, its role is about ensuring a reasonable dynamic range, rather than functional correctness as such and thus accuracy of this compensation function is less critical.

Referring back to FIG. 4, where the amplifier system includes an LC output filter 108, as illustrated, another factor that can impact the transfer function between the input signal Sin and the drive signal output from the filter 108 is that, in DCM, the output LC filter may operate like a lossy integrator.

When operating in DCM, the effective output resistance of the output stage 102 can be seen to increase. This increase in output impedance has an impact on bandwidth and effectively results in a transfer function which somewhat approximates that of an integrator and results in a gain which decreases with frequency in the signal band of interest.

The compensation provided in DCM may thus additionally or alternatively at least partly compensate for the effect of the LC filter when operating in DCM. In effect this may be achieved by including an appropriate differentiate function in the compensation function, with a greater gain at higher frequencies. In some implementations this differentiation could be provided by linear filtering by filter 402. The correct compensation for the lossy integrator effect of the LC output filter 108 may be determined in a factor calibration or may be learned/adapted in use, in which case the feedback signal to the modulator circuit 401 may, as shown, be tapped from after the LC filter. In some implementations, however, the compensation for the integration effect may conveniently be achieved by adding a suitable linear term to the transfer function of the functional block 407 in the modulator forward path.

In use, when operating in DCM, the functional blocks 407 and 408 may thus be enabled to actively apply compensation within the control loop of the amplifier system to provide compensation for the non-linearities that occur in DCM operation and, for adaptive compensation, adaptation of the compensation function will be enabled. When in CCM operation, no such compensation is applied, and any adaption of the compensation function is disabled or paused (as the feedback signal will no longer be representative of the non-linearity of DCM operation). FIG. 4 illustrates that the functional blocks 407 and 408 may be selectively switched in or out of the relevant signal paths of the modulator 403 by the mode controller 406 controlling selector 409 and 410, possibly with some suitable fading being applied when switching between modes, although this is just one example of how compensation may be enabled and disabled.

The mode controller 406 may thus selectively control the amplifier system 400 to operate in either DCM operation or CCM operation as appropriate. DCM can be enabled for lower signal levels, where a period of zero current in the switching cycle can provide power savings. At higher signal levels, DCM operation may not be possible and thus it is advantageous to operate in CCM with complementary switching of the high-side and low-side switches so as to avoid higher conduction losses via the diodes of the switches. The mode controller 406 may monitor the level of the input signal and/or may use a current monitor/zero-crossing detection signal, if available, to determine when to operate using DCM and when to operate in CCM.

The discussion above has focused on amplifier systems which are implemented for driving a load, e.g. an audio transducer or the like, in a single-ended manner. In such a single-ended drive arrangement, where the output stage may modulate the voltages at an output node on one side of the load only, with the other side of the load being held at a nominally fixed DC voltage, DCM operation requires the output switches of the output stage (that selectively connect the output node to a switching voltage) to be off to enable a period of zero output current, which leads to the non-linearities discussed.

Figure 6:
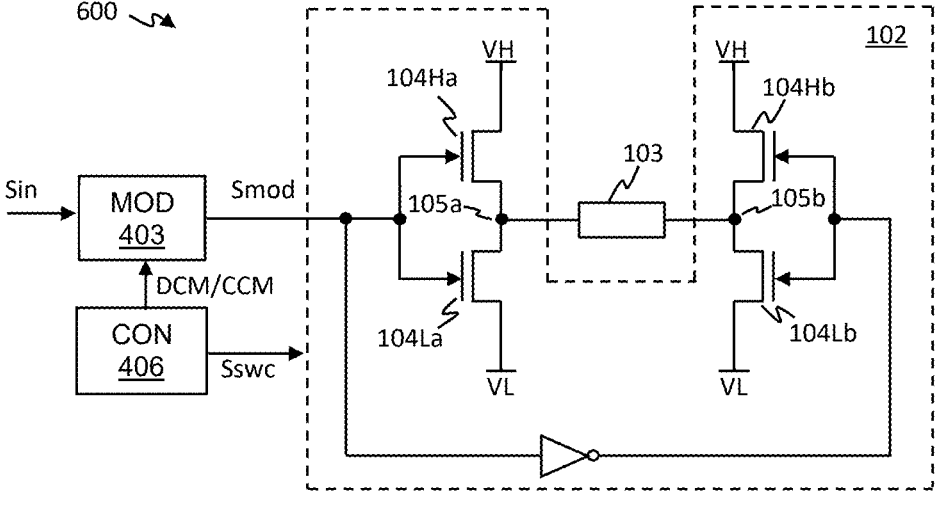
FIG. 6 illustrates an amplifier system for driving a load in a bridge-tied-load configuration.

The principles of the present disclosure may also be applied to amplifier systems which are configured to drive a load in a bridge-tied-load configuration (BTL), i.e. where the output stage may be configured to modulated voltages at each of first and second output nodes where, in use, the load is connected between the first and second output nodes so as to be driven by a differential voltage between the first and second output nodes. FIG. 6 illustrates one example of an amplifier system 600 in which the output stage 102 is configured to drive the load 103 in a BTL configuration. In this example, the output stage is a full bridge arrangement with first and second output nodes 105a and 105b for connection to either side of the load 103. Each of the first and second output nodes 105a and 105b has respective high-side switches, 104Ha and 104Hb, and respective low-side switches 104La and 104Lb, for connecting the relevant output node to the high-side or low-side switching voltage VH or VL.

Such a BTL amplifier system may, in use, be operable in continuous conduction mode, in which there is a differential voltage across the load throughout substantially the whole of the switching cycle, with modulation of the relevant differential voltage with a controlled duty-cycle so as to provide the desired average differential voltage across the load. Thus the output stage 102 may, for example, be switched between two different switch states, a first switch state where the high-side switch 104Ha for the first output node 105a and the low-side switch 104Lb for the second output node 105b are on together and a second switch state where the low-side switch 104La for the first output node 105a and the high-side switch 104Hb for the second output node 105b are both on together, and the output stage may switch between these switch states with a controlled duty-cycle. This operation is typically referred to as AD modulation in the context of BTL class-D amplifiers. Such AD modulation may be achieved, as illustrated in the FIG. 6, by generating a modulated signal Smod to control the high-side and low-side switches 104Ha and 104La on one side of the load and using an inverted version of the modulated signal to control the high-side and low-side switches 104Hb and 104Lb on the other side of the load.

For such a BTL amplifier system, which generally operates in CCM, i.e. is generally operated with AD modulation, the principles of this disclosure discussed above could be applied to implement DCM operation and reduce power losses at lower signal levels. In this case, a discontinuous conduction mode could be implemented by operating in an instance of an off-state, where both the high-side switch and low-side switch for each of the first and second output nodes are off together, i.e. switches 104Ha and 104La are off together, as are switches 104Hb and 104Lb. A mode controller 406 may thus generate switch control signals Sswc for implementing DCM operation of the output stage 102 in a similar manner as discussed above.

This can lead to similar non-linearities as discussed above. The modulator 403 may thus be a modulator such as described with reference to FIG. 4, which includes functional blocks 407 and 408 which can be enabled in the DCM to at least partly compensate for such non-linearities.

It will be noted, however, that in a BTL configuration it is possible to provide a nominally zero differential voltage across the load 103 by turning on both of the high-side switches 104Ha and 104Hb at the same time (with the low-side switches off) or, alternatively, by turning on both of the low-side switches 104La and 104Lb at the same time (with the high-side switches off), so each side of the load is driven to the relevant high-side or low-side voltage. Thus, rather than implement DCM by using a state in which each of the high-side and low-side switches 104Ha, 104Hb, 104La and 104Lb are off, DCM could instead be implemented by operating in a state in which both of the high-side switches or both of the low-side switches are on together.

For example, if the output stage 102 is in a first state, with high-side switch 104Ha on, to connect the first output node 105a to the high side voltage and low-side switch 104Lb on, to connect the second output node 105b to the low side voltage this will lead to a voltage difference across the load with the first output node 105a being more positive than the second output node 105b. This will lead to a ramp up in output current from the first output node 105a to the load. If the output stage 102 is then switched to a state where both low-side switches 104La and 104Lb are on, so that both side of the load are driven to the low-side voltage, the inductance of the load (and LC output filter if present) will result in an output current from the first output node 105a to continue to flow, but to ramp down to zero and then to remain at zero, with no current reversal.

Thus, for CCM operation, the BTL output stage 102 could be switched between the first state, with switches 104Ha and 104Lb on (and 104La and 104Hb off) and a second state, with switches 104La and 104Hb on (and 104Ha and 104Lb off), with a controlled duty cycle. For DCM operation, for a drive signal of a first polarity, the output stage could instead be switched between the first state and a third state, in which both the low-side switches 104La and 104Lb are on (with the high-side switches 104Ha and 104Hb off) and for drive signals of the opposite polarity the output stage could instead be switched between the second state and the third state. In CCM operation the voltage may thus be modulated on one side of the load only during a switching cycle, with the voltage on.

It will be noted that such operation, where both the high-side switches or both the low-side switches are turned on together for part of the switching cycle, may be seen as somewhat similar to known BD modulation schemes for BTL class-D amplifiers and one skilled in the art will understand that BD modulation schemes may provide better linearity. However, BD modulation is typically implemented as an alternative to AD modulation, rather than a different mode which is used for some signal levels. In any event, even with BD modulation schemes, mismatches in the relevant switches, e.g. between the high-side switches 104Ha and 104Hb and/or low-side switches 104La and 104Lb, can result in non-linearities in the output drive signal and there can be benefits in determining and compensating for such non-linearity in accordance with the present disclosure.

Embodiments of the present disclosure thus provide modulator circuits for driving a switched-mode output stage which may be implemented to selectively operate in a discontinuous conduction mode and which can compensate for non-linearities that arise when operating in a discontinuous conduction mode.

Embodiments may be implemented as an integrated circuit. Embodiments may be implemented in a host device, which may be a portable and/or battery powered host device such as a mobile computing device for example a laptop, notebook or tablet computer, or a mobile communication device such as a mobile telephone, for example a smartphone. The device could be a wearable device such as a smartwatch. The host device could be a games console, a remote-control device, a home automation controller or a domestic appliance, a toy, a machine such as a robot, an audio player, a video player. It will be understood that embodiments may be implemented as part of a system provided in a home appliance or in a vehicle. There is further provided a host device incorporating the above-described embodiments.

The skilled person will recognise that some aspects of the above-described apparatus and methods may be embodied as processor control code, for example on a non-volatile carrier medium such as a disk, CD- or DVD-ROM, programmed memory such as read only memory (Firmware), or on a data carrier such as an optical or electrical signal carrier. For some applications, embodiments may be implemented on a DSP (Digital Signal Processor), ASIC (Application Specific Integrated Circuit) or FPGA (Field Programmable Gate Array). Thus, the code may comprise conventional program code or microcode or, for example code for setting up or controlling an ASIC or FPGA. The code may also comprise code for dynamically configuring re-configurable apparatus such as re-programmable logic gate arrays. Similarly, the code may comprise code for a hardware description language such as Verilog TM or VHDL (Very high-speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A modulator circuit for generating a modulated signal based on an input signal for driving a switching output stage comprising an output node, a high-side switch configured to selectively connect the output node to a high-side voltage and a low-side switch configured to selectively connect the output node to a low-side, wherein the modulator circuit comprises:

a modulator configured to be operable to generate the modulated signal for controlling a duty-cycle of each of the high-side switch and low-side switch in a switching cycle in a complementary manner in continuous conduction mode of operation;

the modulator being further configured to generate the modulated signal to control the duty-cycle of at least one of the high-side switch and low-side switch in a discontinuous conduction mode of operation where there is a period in each switching cycle where both the high-side switch and the low-side switch are off;

the modulator circuit further comprises a compensator operable to apply compensation to a forward signal path of the modulator circuit in the discontinuous conduction mode of operation, wherein said compensation at least partly compensates for a non-linearity in a transfer function of the modulator circuit and output stage when operating in the discontinuous conduction mode;

wherein said modulator comprises a PWM modulator, wherein the PWM modulator has a forward modulator signal path and a modulator feedback path and wherein the compensator comprises a first function block configured to apply a first compensation function to the modulator forward signal path and a second function block configured to apply a second compensation function to the modulator feedback signal path.

2. The modulator circuit of claim 1 wherein the first compensation function corresponds to an approximate inverse of said non-linearity and the second compensation function corresponds to said non-linearity.

3. The modulator circuit of claim 1 wherein the modulator forward signal path comprises a modulator filter upstream of a quantizer and the compensator is configured to apply the first compensation function to the modulator forward signal path between the modulator filter and the quantizer.

4. The modulator circuit of claim 1 wherein the first and second compensation functions are determined as at least one of: a look-up table, a polynomial or spline function and a neural net.

5. The modulator circuit of claim 1 wherein said first and second compensation functions are predetermined stored compensation functions.

6. The modulator circuit of claim 1 wherein said compensator is configured to receive an indication of an output signal which is output from the output stage and to adapt or learn the compensation required in the discontinuous conduction mode of operation.

7. The modulator circuit of claim 6 wherein the compensator is configured to receive a feedback signal from the output node of the output stage as said indication of the output signal.

8. The modulator circuit of claim 6 wherein the compensator is configured to receive a feedback signal from downstream of an output LC filter connected to the output node of the output stage as said indication of the output signal and wherein the compensator is further configured to at least partly compensate for the transfer function of the LC filter in the discontinuous conduction mode.

9. The modulator circuit of claim 6 wherein the compensator is configured to use at least one of a least squares algorithm or stochastic gradient descent algorithm to determine the compensation function.

10. The modulator circuit of claim 6 wherein the compensator is configured to initially use a first learning algorithm to determine the compensation function and then swap to using a second learning algorithm to refine the compensation function, wherein the first learning algorithm is faster than the second learning algorithm but the second learning algorithm is less computationally intensive than the first learning algorithm.

11. The modulator circuit of claim 1 further comprising a mode controller for controlling operation of the modulator circuit in the continuous conduction mode or the discontinuous conduction mode.

12. The modulator circuit of claim 11 wherein the mode controller is configured to control operation of the modulator circuit in the continuous conduction mode or the discontinuous conduction mode of operation based on at least one of: a signal level of the input signal and an indication of current reversal at the output node of the output stage during a switching cycle.

13. The modulator circuit of claim 11 wherein the modulator circuit is further configured to generate one or more switching control signals for controlling operation of the output stage in the continuous conduction mode or the discontinuous conduction mode of operation.

14. An amplifier system comprising the modulator circuit of claim 1 and said output stage.

15. An amplifier system for outputting an output signal to drive a transducer based on an input signal, the amplifier system comprising:

a switching output stage comprising an output node, a high-side switch configured to selectively connect the output node to a high-side voltage and a low-side switch configured to selectively connect the output node to a low-side;

a modulator configured to generate a modulated signal based on the input signal;

a mode controller configured to control the switching output stage to selectively operate in one of:

a continuous conduction mode of operation in which the high-side switch and the low-side switch are switched in a switching cycle in a complementary manner and the duty-cycle of each of the high-side switch and low-side switch is controlled based on the modulated signal; and a discontinuous conduction mode of operation in which there is a period in each switching cycle where there is zero output current at the output node and the duty-cycle of one of the high-side switch and low-side switch is controlled on the modulated signal; and a compensator configured to apply compensation in the discontinuous conduction mode of operation to at least partly compensate for a non-linearity in a transfer function of the amplifier system when operating in the discontinuous conduction mode;

wherein said modulator comprises a PWM modulator, wherein the PWM modulator has a forward modulator signal path and a modulator feedback path and wherein the compensator comprises a first function block configured to apply a first compensation function to the modulator forward signal path and a second function block configured to apply a second compensation function to the modulator feedback signal path.

16. The amplifier system of claim 15 wherein in the discontinuous conduction mode of operation there is a period in each switching cycle where both the high-side switch and the low-side switch are off so as to provide said period where there is zero output current at the output node.

\* \* \* \* \*